(12) United States Patent
Wilhelmsson et al.

(10) Patent No.: US 8,983,471 B2
(45) Date of Patent: Mar. 17, 2015

(54) COMPLEX INTERMEDIATE FREQUENCY BASED RECEIVER ARCHITECTURE

(75) Inventors: Leif Wilhelmsson, Dalby (SE); Lars Sundstrom, Sodra Sandby (SE); Fenghao Mu, Hjarup (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 26 days.

(21) Appl. No.: 13/983,566

(22) PCT Filed: Jan. 25, 2012

(86) PCT No.: PCT/EP2012/051108
§ 371 (c)(1),
(2), (4) Date: Oct. 19, 2013

(87) PCT Pub. No.: WO2012/107286
PCT Pub. Date: Aug. 16, 2012

(65) Prior Publication Data
US 2014/0051441 A1 Feb. 20, 2014

Related U.S. Application Data

(60) Provisional application No. 61/446,230, filed on Feb. 24, 2011.

(30) Foreign Application Priority Data

Feb. 11, 2011 (EP) .................................... 11001147

(51) Int. Cl.
*H04W 36/30* (2009.01)
*H03D 7/18* (2006.01)
*H04B 17/00* (2006.01)

(52) U.S. Cl.
CPC ................. *H04W 36/30* (2013.01); *H03D 7/18* (2013.01); *H04B 17/0045* (2013.01); *H04B 17/006* (2013.01); *H03D 2200/0045* (2013.01)
USPC .............................. 455/436; 370/329; 375/214

(58) Field of Classification Search
CPC ............................ H04W 36/30; H04B 17/0045
USPC .................... 455/436, 226.1, 226.3; 370/329; 375/214
See application file for complete search history.

(56) References Cited

U.S. PATENT DOCUMENTS 6,330,290 B1 12/2001 Glas
7,272,374 B2 9/2007 Tuttle et al.
(Continued)

FOREIGN PATENT DOCUMENTS

WO 99/14863 A1 3/1999

OTHER PUBLICATIONS

PCT International Search Report and Written Opinion, mailed Mar. 8, 2012, in connection with International Application No. PCT/EP2012/051108, all pages.

*Primary Examiner* — Phuoc H Doan
(74) *Attorney, Agent, or Firm* — Leffler Intellectual Property Law, PLLC (57) ABSTRACT

The disclosure relates to a Complex Intermediate Frequency (CIF)-based receiver adapted to process a received signal comprising a signal component at a desired frequency and a signal component as an image frequency. The CIF-based receiver determines the power of the received signal by calibrating the receiver to minimize the power of the signal component at the image frequency that interferes with the signal component at the desired frequency, introduces signal leakage from the image frequency to intentionally degrade the quality of the signal component at the desired frequency, and determines the power of the signal component at the image frequency based on the amount of degradation.

23 Claims, 11 Drawing Sheets

(56) References Cited

U.S. PATENT DOCUMENTS

| | | |
|---|---|---|
| 7,565,112 B2 | 7/2009 | Ragan |
| 2008/0132191 A1 | 6/2008 | Quinlan et al. |
| 2008/0261548 A1 | 10/2008 | Krone |
| 2009/0191828 A1 | 7/2009 | Ibrahim et al. |
| 2011/0194510 A1* | 8/2011 | Gaal et al. .................... 370/329 |
| 2013/0114651 A1* | 5/2013 | Ranson et al. ................ 375/214 |

* cited by examiner

COMPLEX INTERMEDIATE FREQUENCY BASED RECEIVER ARCHITECTURE

CROSS-REFERENCE TO RELATED APPLICATIONS

This application claims priority under 35 U.S.C. §119 to European Patent Application No. 11001147.5, filed Feb. 11, 2011, which is hereby incorporated herein by reference in its entirety. This application also claims the benefit of U.S. Provisional Application No. 61/446,230, filed Feb. 24, 2011, which is hereby incorporated herein by reference in its entirety.

TECHNICAL FIELD

The present disclosure relates to signal processing using a Complex Intermediate Frequency (CIF)-based receiver architecture and, in particular, to a technique for determining signal power in a CIF based receiver.

BACKGROUND

In a radio communication network, certain network elements or devices need to, from time to time, perform different forms of signal measurement in order to determine what signals are available. The device performing the signal measurement could for instance be a moving user equipment (UE) intending to handover to another base station or access point. Usually, such handover implies that slightly different transmission (TX) and/or reception (RX) frequencies are used; the reason behind this difference is the fact that in a radio communication network, for the benefit of interference coordination, the base stations which serve adjacent cells are usually configured to operate on different frequencies.

Once the UE is connected to a base station, it thus conducts signal measurement to obtain knowledge of what other base stations may be available and of the frequency or frequencies they are transmitting on. This knowledge allows the UE to locate neighbouring base stations in order to determine if a handover should be performed.

In case the UE is active transmitting data to a base station or receiving data therefrom, performing the above described signal measurement implies that there must be certain time intervals, or gaps, available so that the signal receiver equipment of the UE can switch to another frequency in order to perform the measurement. This means that the data rate should be increased during the time when the measurement is not performed in order to compensate for the fact that the effective reception time for the desired signal is decreased. Although such kinds of intervals for performing signal measurement may be regulated by a standard, it is highly desirable that the resulting gaps can be avoided or at least minimized. A solution in the conventional art is to use a separate receiver for performing signal measurement, but this approach is costly.

SUMMARY

Accordingly, there is a need for a solution which facilitates a receiver to perform combined signal scanning and reception.

According to a method aspect, a method of determining signal power in a CIF-based receiver is provided. The CIF-based receiver is adapted to process a received signal which comprises a signal component at a desired frequency and a signal component at an image frequency. The method comprises the following steps: calibrating the CIF-based receiver to minimize the power of the signal component at the image frequency that interferes with the signal component at the desired frequency, introducing signal leakage from the image frequency in order to intentionally degrade the quality of the signal component at the desired frequency, and determining the power of the signal component at the image frequency based on the amount of degradation.

The CIF-based receiver may comprise at least one RF mixer and a plurality of IF mixers. At least one of the IF mixers may be adjusted to cancel the mismatch caused by the at least one RF mixer for at least one of the desired frequency and the image frequency. The mismatch caused by the RF mixer may be related to, among others, the image rejection ratio, IRR, of the CIF-base receiver; that is, the mismatch indicates, or defines, among others, to what extent the signal component at the image frequency leaks into the desired frequencies or vice versa.

The method may further determine the IRR of the CIF-based receiver, which may then be used together with the amount of signal quality degradation to determine (e.g., estimate) the power of the signal component at the image frequency. The IRR may be calculated as a function of parameter settings in one or more IF mixers. The method may further determine a signal-to-noise ratio, SNR, of the desired signal component.

Still further, a signal-to-image-ratio, SIR, may be determined as a further step of the method. SIR is defined as a ratio between the power of the desired signal component and the power of the image signal component. The SIR may be determined based on the SNR once the latter is determined. The SIR may be determined by means of a channel estimator. Further, using the SIR, the power of the signal component at the image frequency may be determined based on the power of the signal component at the desired frequency.

The method may further comprise the step of performing signal reception at a certain desired frequency simultaneously with determining the power of the signal component at the image frequency.

The image frequency may be altered in order to allow the signal power to be determined for more than one specific frequency. Hence, signal power determination may be performed with respect to a plurality of frequencies. This may become necessary in a handover context or a carrier aggregation context. Carrier aggregation is a distinct feature of Long Term Evolution, LTE, systems. As a preferable solution to the LTE's requirement of broad transmission bandwidth, carrier aggregation allows expansion of the effective bandwidth delivered to a user terminal through concurrent utilization of radio resources across multiple carriers. That is, multiple component carriers are aggregated to form a larger overall transmission bandwidth.

Subsequent to signal power determination with respect to the plurality of frequencies, a certain frequency among the plurality of frequencies may be selected. At least one of the above-mentioned frequency-altering and frequency-selection may be based on the list of suitable frequencies obtained from a communication network.

The technique presented herein can be practised by means of hardware, software or a combined hardware/software approach. As for a software aspect, a computer program product is provided. The computer program product comprises program code portions for performing the steps of any one of the methods described herein when the computer program product is run on a computing device that may be part of a receiver or one or more network elements of a radio communication network. Further, the computer program product may be stored on a computer-readable recording medium.

According to an apparatus aspect, a receiver comprising a dual carrier CIF mixer stage adapted to process a received signal is provided. The received signal comprises a signal component at a desired frequency and a signal component at an image frequency. The receiver is adapted to calibrate the CIF mixer stage to minimize the power of the signal component at the image frequency that interferes with the signal component at the desired frequency, introduce signal leakage from the image frequency in order to intentionally degrade the quality of the signal component at the desired frequency, and determine the power of the signal component at the image frequency based on the amount of degradation. These and other receiver operations may be performed by dedicated hardware and/or software components.

The receiver may further comprise at least one RF mixer, and the CIF mixer stage of the receiver may further comprise a plurality of IF mixers. The receiver may be adapted to adjust at least one of the IF mixers so as to cancel mismatch caused by the at least one RF mixer for at least one of the desired frequencies and the image frequency.

The receiver may be further adapted to determine an image rejection ratio, IRR. This may be achieved by, e.g., calculating the IRR based on the parameter settings of at least one of the IF mixers. Still further, the receiver may be adapted to determine the power of the signal component at the image frequency based on the power of the signal component at the desired frequency using a signal-to-image-ratio, SIR, which is defined as a ratio between the power of the desired signal component and the power of the image signal component.

The receiver may be adapted to perform signal reception at one desired frequency simultaneously with determining the power of the signal component at a corresponding image frequency.

The receiver may be adapted to alter the image frequency while still receiving the desired signal at the same frequency. In this way, the receiver may determine the signal power for more than one specific frequency. That is, the receiver may determine the signal power with respect to a plurality of frequencies. This allows the receiver to subsequently select a frequency from the plurality of frequencies. Such frequency alternation and/or frequency selection may be useful in certain contexts, such as a handover context and a carrier aggregation context. The receiver may be further adapted to alter the image frequency or select the frequency among the plurality of the frequencies based on a list of suitable frequencies obtained from a communication network.

The receiver may be integrated in for instance one of the following devices: a user terminal, a base station, an access point.

BRIEF DESCRIPTION OF THE DRAWINGS

In the following, exemplary CIF-based receiver architectures and related methods are described with reference to the exemplary embodiments illustrated in the drawings, wherein.

DETAILED DESCRIPTION

In the following, for purposes of explanation and not limitation, specific details are set forth, such as particular sequences of method steps, particular device layouts, and particular signals or signal components, in order to provide a thorough understanding of the technique presented herein. It will be apparent to those skilled in the art that the CIF-based receiver and the related methods presented herein may be implemented in other embodiments which depart from these specific details.

Moreover, those skilled in the art will appreciate that the functions explained herein below may be, completely or in part, implemented using software functioning in conjunction with a programmed microprocessor or general-purpose computer. It will also be appreciated that while the technique is primarily described in the form of methods and apparatuses, the technique may be equally embedded at least partially in a computer program product as well as in a system comprising a computer processor and a memory coupled to the processor wherein the memory is encoded with one or more programs that may perform the function disclosed herein.

The basic concept of the following exemplary embodiments is to use a receiver based on a Complex Intermediate Frequency (CIF) architecture and to intentionally introduce leakage from the image frequency in a controlled manner. In this way, the value of the image rejection ratio will be become available and therefore the power of a signal or signal component located at the image frequency can be determined (e.g., estimated). Since this concept can be implemented using the same signal path as that used for the reception of a desired signal or signal component, signal measurement can, if desired, be performed without the need for introducing measurement gaps (or additional receivers or receiver paths). Specifically, by controlling the leakage properly, signal measurement can be done such that the desired signal is only degraded to an extent that is acceptable.

Figure 1:
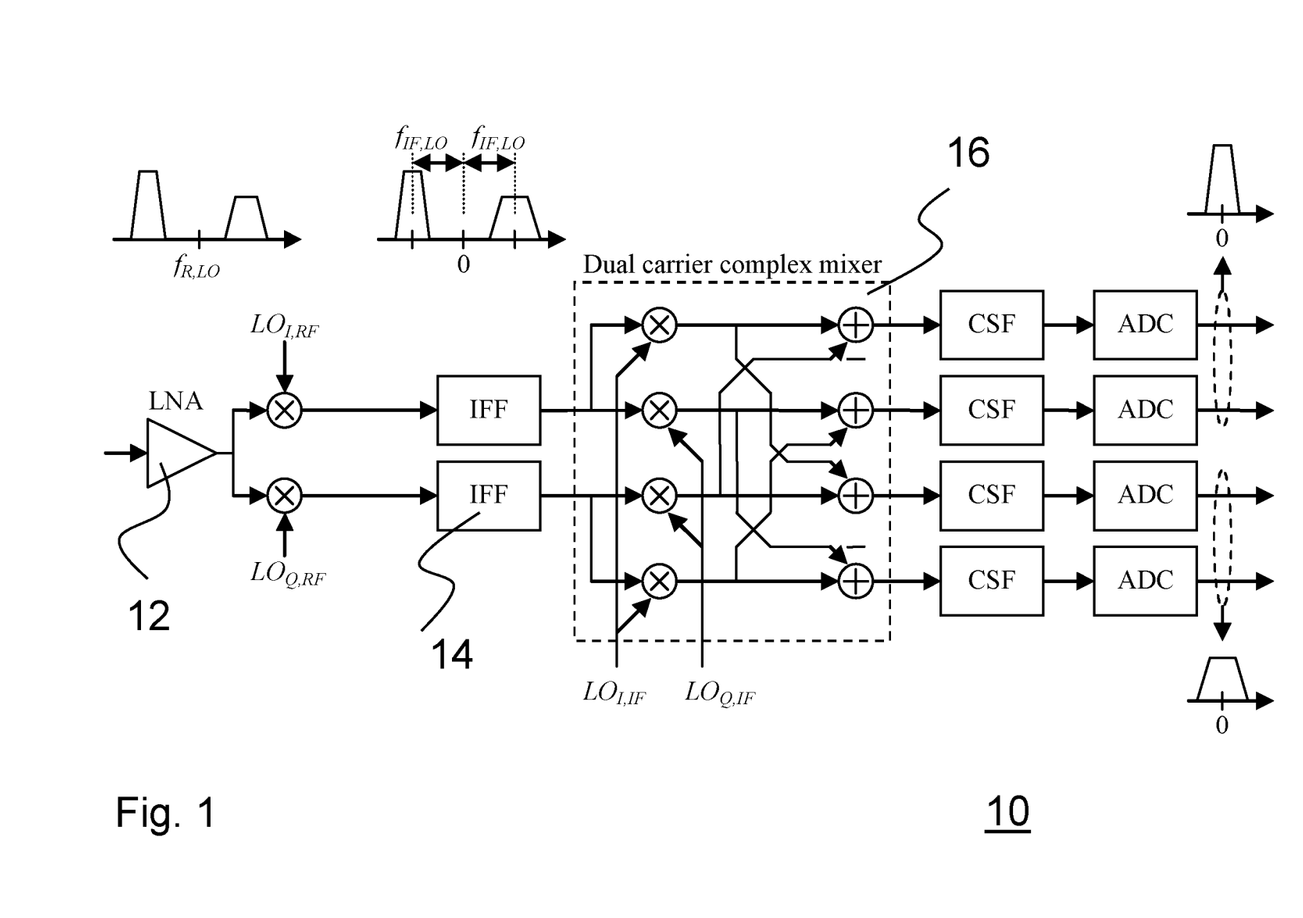
FIG. 1 is a block diagram showing the basic architecture of a CIF-based receiver.

The receiver for implementing the technique presented herein is one based on the CIF architecture. The CIF-based receiver converts a received signal, such as a Radio Frequency (RF) signal, to an Intermediate Frequency (IF) signal and subsequently converts the IF signal to a Baseband (BB) frequency signal. An exemplary architecture of such a receiver 10 in which the technique presented herein can be implemented is depicted in FIG. 1. The receiver 10 is designed to process two carriers simultaneously, although designs for other purposes or functions are also available.

As illustrated in FIG. 1, a received RF signal is initially fed to a Low-Noise Amplifier 12 (LNA) of the CIF-based receiver 10. The amplified signal is subjected to a quadrature RF conversion where the frequency of the driving clock signal, such as a local oscillator (LO) signal, is set to the center of the two carriers such that the desired RF signals carried by the two carriers can be converted to IF signals having substantially the same frequency. The complex output of the RF converter, including an In-phase (I) signal on the I-channel and a Quadrature-phase (Q) signal on the Q-channel, comprises the desired signals carried on both carriers. The lower frequency signal appears on the negative side while the higher frequency signal appears on the positive side. Filters, such as the two Intermediate Frequency Filters (IFF) 14 shown in FIG. 1, are used to filter out the unwanted signals and suppress interference.

A complex mixer 16, such as the dual-carrier complex mixer illustrated in the middle of FIG. 1, is used to convert the two signals, the I-signal and the Q-signal, to baseband (BB). In other words, the I-signal and the Q-signal on the two carriers are converted to respective BB signals. Thereafter, channel select filtering (CSF) and analogue-to-digital conversion (ADC) are performed. Note that FIG. 1 shows a rather simplified view of the receiver architecture with the purpose only to exemplify the basic elements of a CIF-based receiver.

Figure 2:
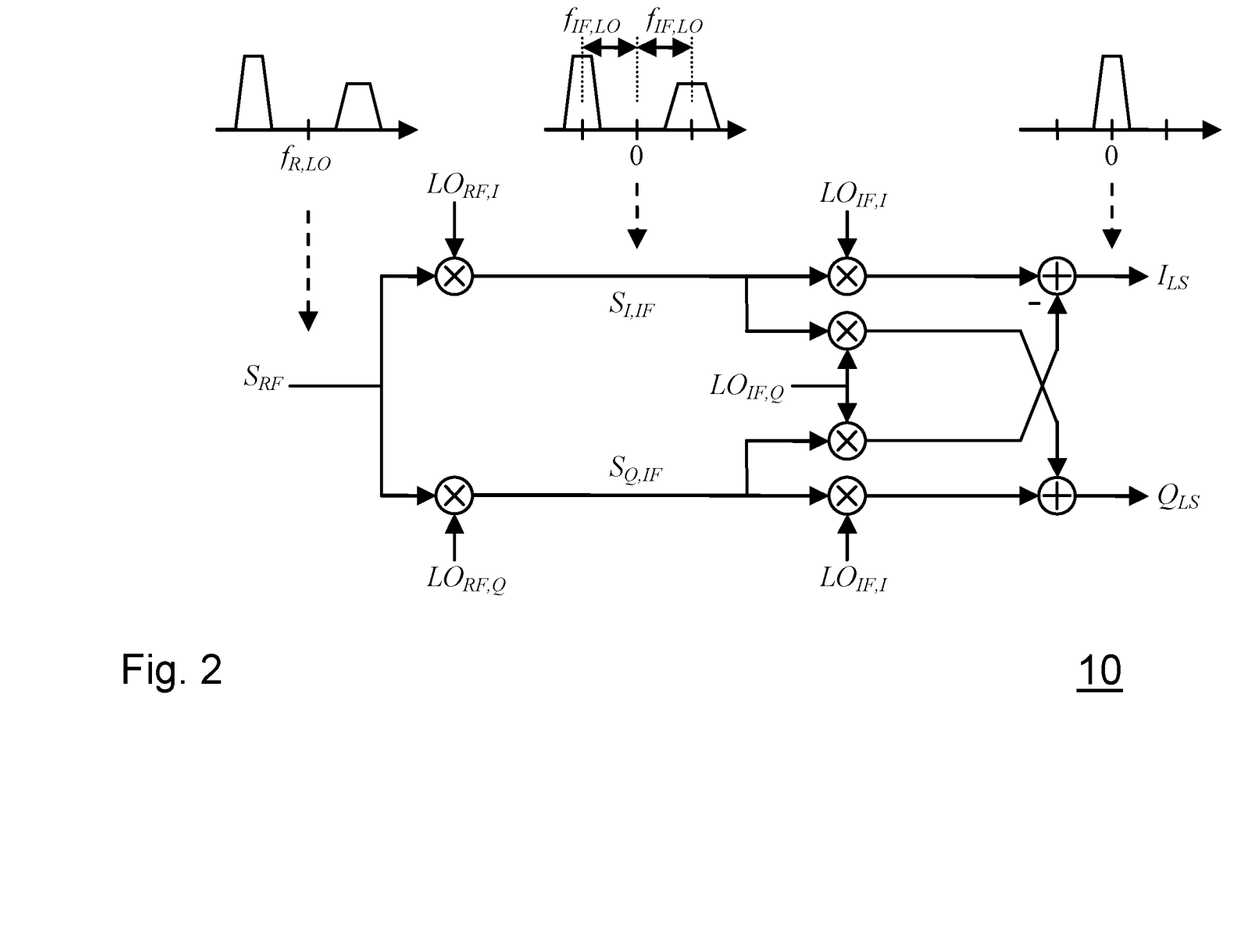
FIG. 2 is a block diagram showing the frequency conversion operation for the lower side carrier of the CIF-based receiver of FIG. 1.

With respect to FIG. 1, a further simplification can be made where only the frequency conversion operations are considered. This is shown in FIG. 2 where the frequency conversion for the lower side (LS) carrier is presented. The corresponding diagram for two carriers (the lower side (LS) carrier and the upper side (US) carrier) is shown in FIG. 3.

Figure 3:
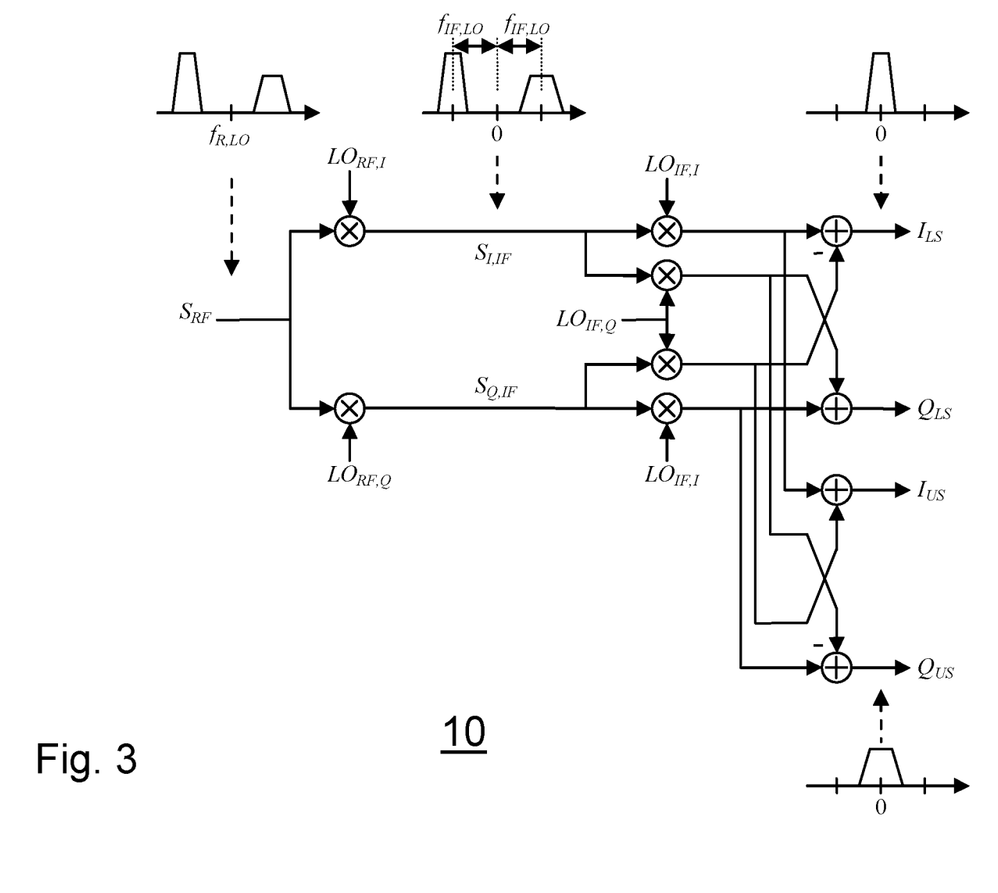
FIG. 3 is a block diagram showing the frequency conversion operation for both the lower side carrier and the upper side carrier of the CIF-based receiver of FIG. 1.

It is well-known that a CIF-based architecture as the one illustrated in FIGS. 1 to 3 usually suffers from IQ-imbalance, or mismatch, originating from both the RF mixer and the IF mixer, and that the RF mixer is typically the major source for the IQ-imbalance. A mismatch in the delay between the in-phase path and the quadrature path will increase with the frequency increase as such phase mismatch is proportional to the frequency.

The IQ-imbalance includes gain and phase imbalance, and receiver performance in this respect is usually measured as an image-rejection ratio, IRR. For RF quadrature mixers the IRR is typically in the range of 30 to 40 dB. In the architecture shown in FIG. 1, a finite image rejection may cause the lower side carrier to leak into the upper side carrier and vice versa. Gain and phase imbalance will also be introduced by the IF filters and the complex mixers. The complex mixer may, however, feature a better IRR as it operates with much lower frequencies.

If the power level of one desired carrier is higher or substantially equal to the signal at the image frequency, an IRR of 30 dB may suffice in most cases. On the other hand, if the other signal is much stronger, for example a blocking signal, the image of this signal may mask the desired signal.

Figure 4:
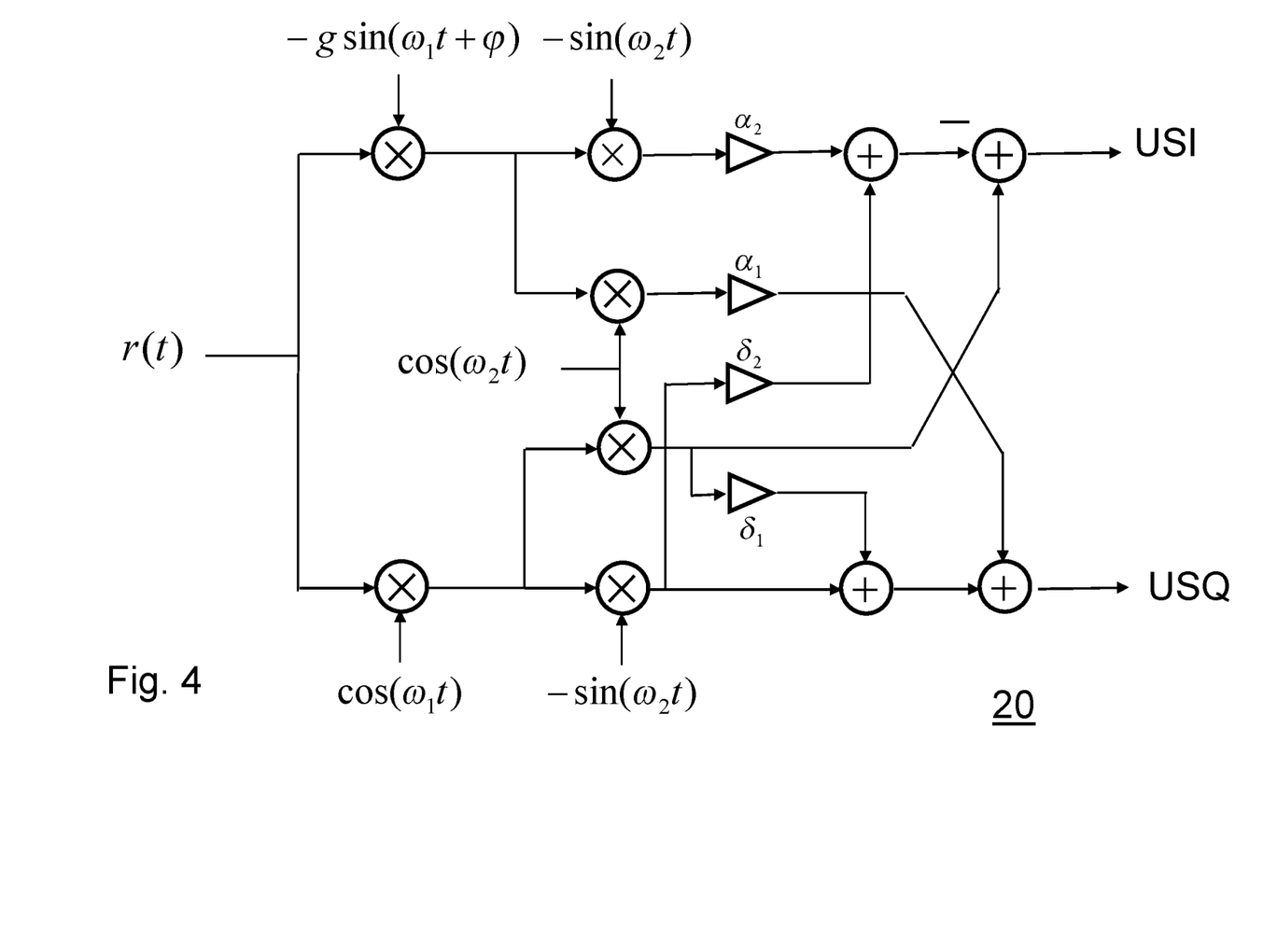
FIG. 4 is a diagram showing a simplified view of an embodiment of a CIF-based receiver with an adjustable IF mixer whose gain and leakage parameters are adjustable.
Figure 5:
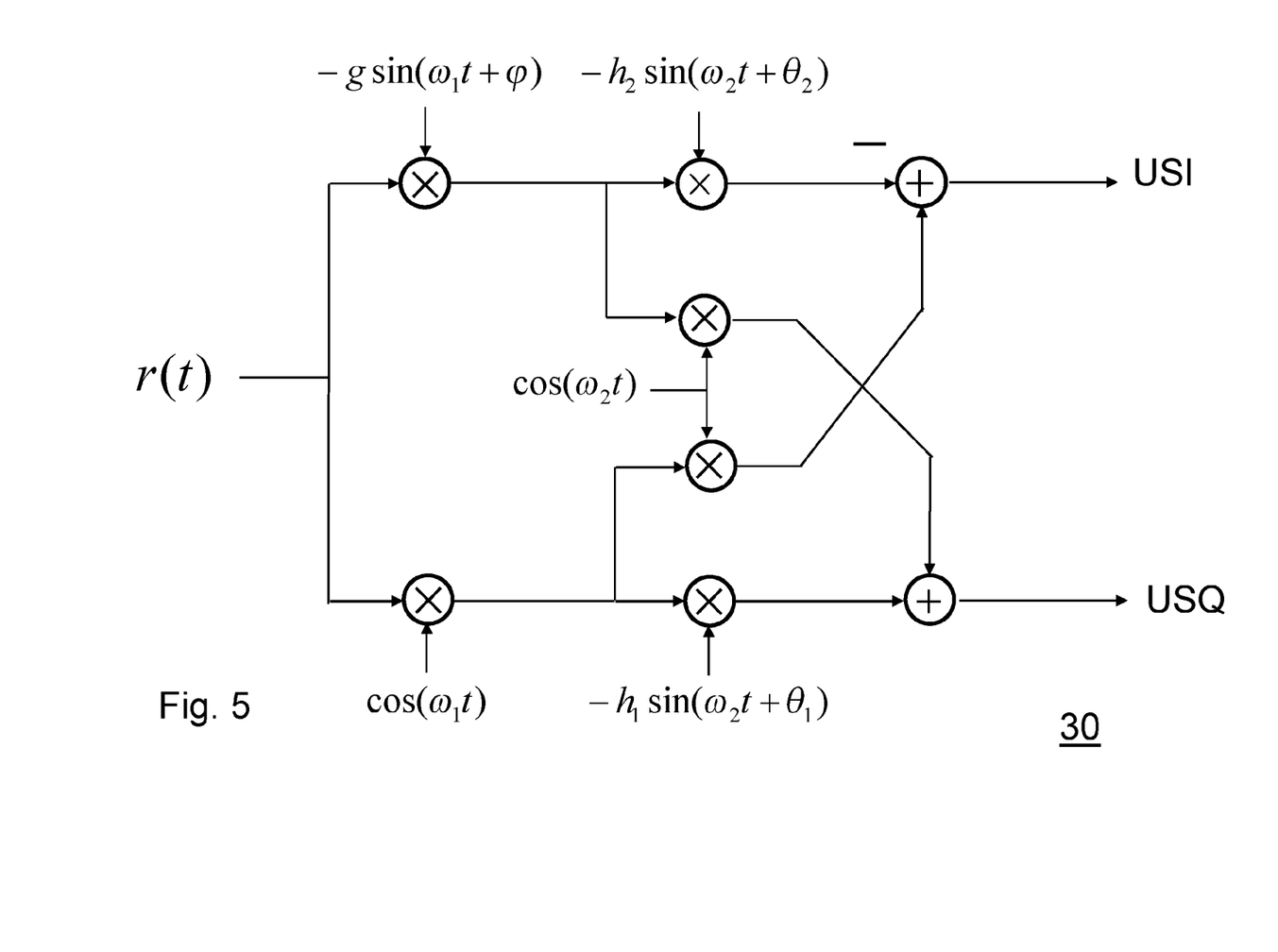
FIG. 5 is another diagram showing a simplified view of another embodiment of a CIF-based receiver with an adjustable IF mixer whose gain and leakage parameters are adjustable.

Based on the general CIF-based receiver design depicted in FIGS. 1 to 3, the CIF-based receiver according to the technique presented herein can be implemented in various architectures which facilitate a reduction of IQ-imbalance. FIGS. 4 and 5 illustrate embodiments of simplified CIF-based receiver architectures that can be implemented in a similar manner as shown in FIG. 1.

A first applicable receiver architecture 20 is shown in FIG. 4. With this architecture 20, IQ-imbalance caused by the RF mixer can be compensated by a configurable IF mixer which allows the gain and the leakage in the IF mixer to be adjusted via dedicated parameters $\alpha_1$, $\alpha_2$, $\delta_1$, $\delta_2$ of the IF mixer. These parameters of the IF mixer can be calibrated (e.g., configured or adjusted), to suppress or intentionally introduce image interference and IQ leakage in the CIF-based receiver configured in accordance with FIG. 4.

Specifically, FIG. 4 illustrates an in-phase component for the Upper Sideband (USI) and a quadrature component for the Upper Sideband (USQ); in other words, the CIF-based receiver 20 processes a received signal comprising two signal components, which can be viewed as one at a desired frequency and the other at an image frequency. In addition, FIG. 4 illustrates what the two signal components will look like as a function of the dedicated amplification parameters $\alpha_1$, $\alpha_2$, $\delta_1$, $\delta_2$ of the IF mixer.

For example, the two signal components can be expressed as below:

$$USI = \frac{1+g\alpha_2\cos(\varphi)}{2}\cos(\omega_1+\omega_2)t + \frac{\delta_2-\alpha_2 g\sin(\varphi)}{2}\sin(\omega_1+\omega_2)t +$$
$$\frac{1-g\alpha_2\cos(\varphi)}{2}\cos(\omega_1-\omega_2)t - \frac{\delta_2-\alpha_2 g\sin(\varphi)}{2}\sin(\omega_1-\omega_2)t$$
$$USQ = \frac{\alpha_1 g\sin(\varphi)-\delta_1}{2}\cos(\omega_1+\omega_2)t - \frac{1+\alpha_1 g\cos(\varphi_1)}{2}\sin(\omega_1+\omega_2)t -$$
$$\frac{\alpha_1 g\sin(\varphi)-\delta_1}{2}\cos(\omega_1-\omega_2)t + \frac{1-\alpha_1 g\cos(\varphi_1)}{2}\sin(\omega_1-\omega_2)t$$

Since the desired signal is located at the upper sideband, the image components are those with the frequency components located at $\omega_1-\omega_2$.

In an alternative embodiment, rather than adjusting the gain and the leakage in the signal paths, the gain and the phase in the IF mixer can be adjusted via dedicated phase offsets $\theta_1$, $\theta_2$ of the IF mixer. An embodiment of an architecture 30 in accordance with this implementation is shown in FIG. 5.

Figure 11:
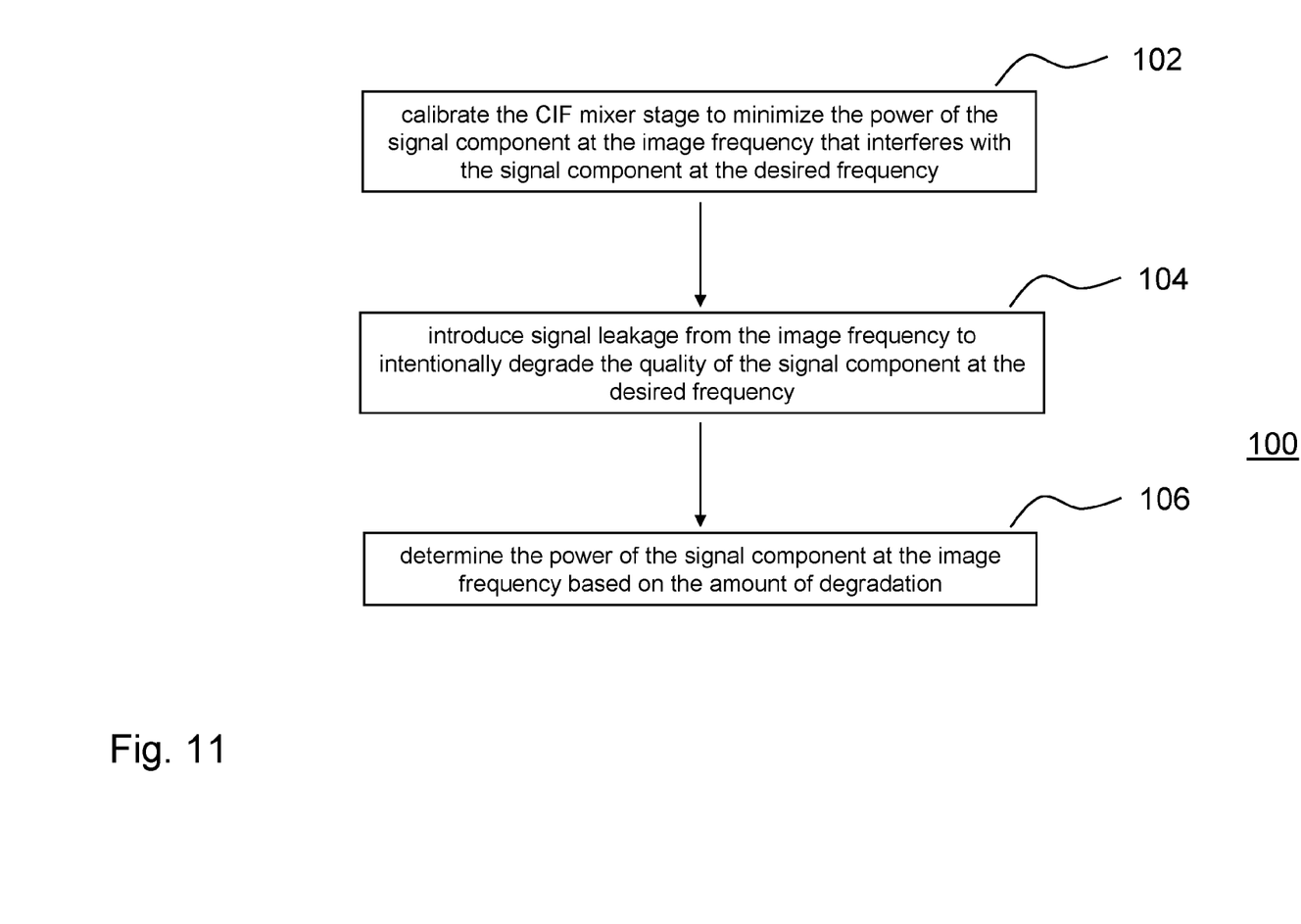
FIG. 11 is a flow diagram showing a method embodiment for determining signal power in a CIF-based receiver.

A basic method embodiment 100 performed by a CIF-based receiver in accordance with FIGS. 4 and 5 to determine signal power is shown in FIG. 11. As shown in FIG. 11, the method 100 comprises three main steps. At step 102, the CIF-based receiver is calibrated to minimize the power of the signal component at the image frequency that interferes with the signal component at the desire frequency. At step 104, signal leakage from the image frequency is introduced in order to intentionally degrade the quality of the signal component at the desired frequency. At step 106, the power of the signal component at the image frequency is determined based on the amount of degradation. These steps will in the following be described in more detail.

With respect to the CIF-based receiver 10 shown in FIG. 1, and incorporating the specific architectures 20 and 30 respectively shown in FIG. 4 and FIG. 5, it is possible to calibrate the CIF-based receiver 10 to influence the power of the signal component at the image frequency that interferes with the signal component at the desired frequency. This function corresponds to step 102 of the method 100 shown in FIG. 11.

For instance, it is possible to calibrate (e.g., adjust or configure) various parameters in the IF mixer so that the effect of mismatch in the RF mixer can be partially or completely cancelled for at least one of the sidebands. More generally, when the CIF-based receiver comprises one or more RF mixers and/or one or more IF mixers, it is possible to adjust at least one of the IF mixers to cancel the mismatch caused by at least one of the RF mixers for at least one of the desired frequency and the image frequency. The mismatch caused by the RF mixers defines, among others, to what extent the signal component at the image frequency leaks into the desired frequency or vice versa.

For simplicity, but without loss of generality, it is supposed that there is no mismatch in the RF mixer, i.e., g=1; φ=0. Moreover, it is chosen that $\alpha_1=\alpha_2=1$; $\delta_1=\delta_2=0$, and thus there will be no leakage from the lower sideband.

Next, leakage parameter $\delta_1$ is intentionally adjusted to be non-zero, which implies that leakage is intentionally introduced corresponding to step 104 of the method 100 shown in FIG. 11. It is thus possible to obtain knowledge of the image rejection ration, IRR.

It follows from the formulas above that the introduction of leakage from the image frequency will have no effect on the in-phase component, but the quadrature component will become $$USQ = \frac{\delta_1}{2}\cos(\omega_1 + \omega_2) + \frac{\delta_1}{2}\cos(\omega_1 - \omega_2)t$$

If the interference leakage from the lower sideband is treated as additive noise, it is straight-forward to see that the effective signal-to-noise ratio, SNR, of the upper sideband can be determined by $$SNR_{eff} = \frac{2}{(\delta_1/2)^2 + \frac{1}{SIR}(\delta_1/2)^2 + 2/SNR}$$

In the above formula, SNR is the signal-to-noise ratio, and SIR is the signal-to-image-ratio, which is a ratio between the power of the desired signal and the power of the signal at the image frequency. The factor of two in the numerator and in last term in the denominator is caused by that the in-phase components were not affected, thus resulting in that the impact will be halved. The effective SNR may be determined by numerous means, one of which is by a channel estimator. The channel estimator may use known pilot symbols for estimating the effective SNR. Alternatively, the SNR can be estimated in the IQ-diagram, using the equalized data.

Figure 6:
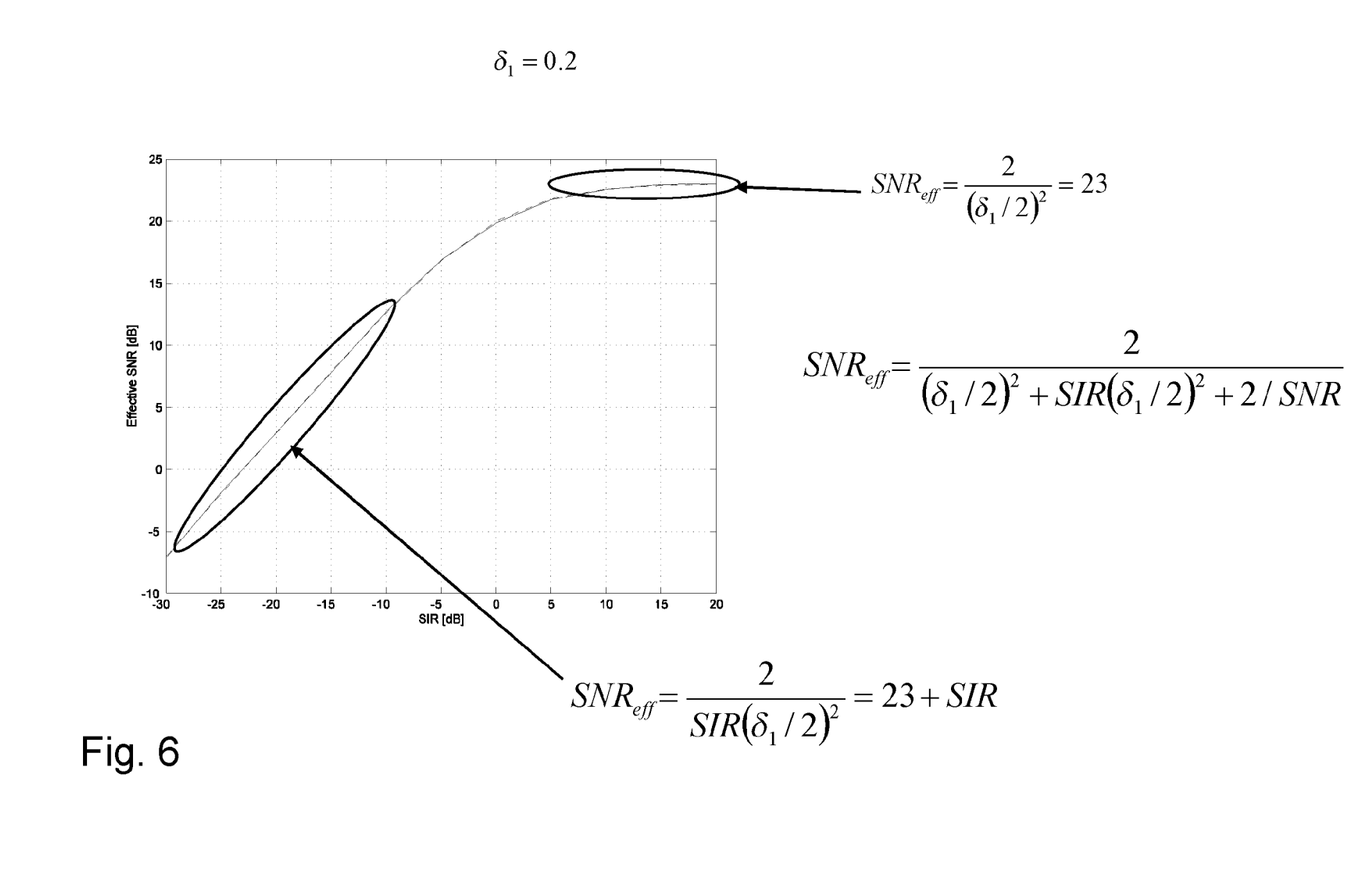
FIG. 6 shows a simulation result of the estimated effective SNR compared to the corresponding expected theoretical values where SNR=100 dB and $\delta_1$=0.2.
Figure 7:
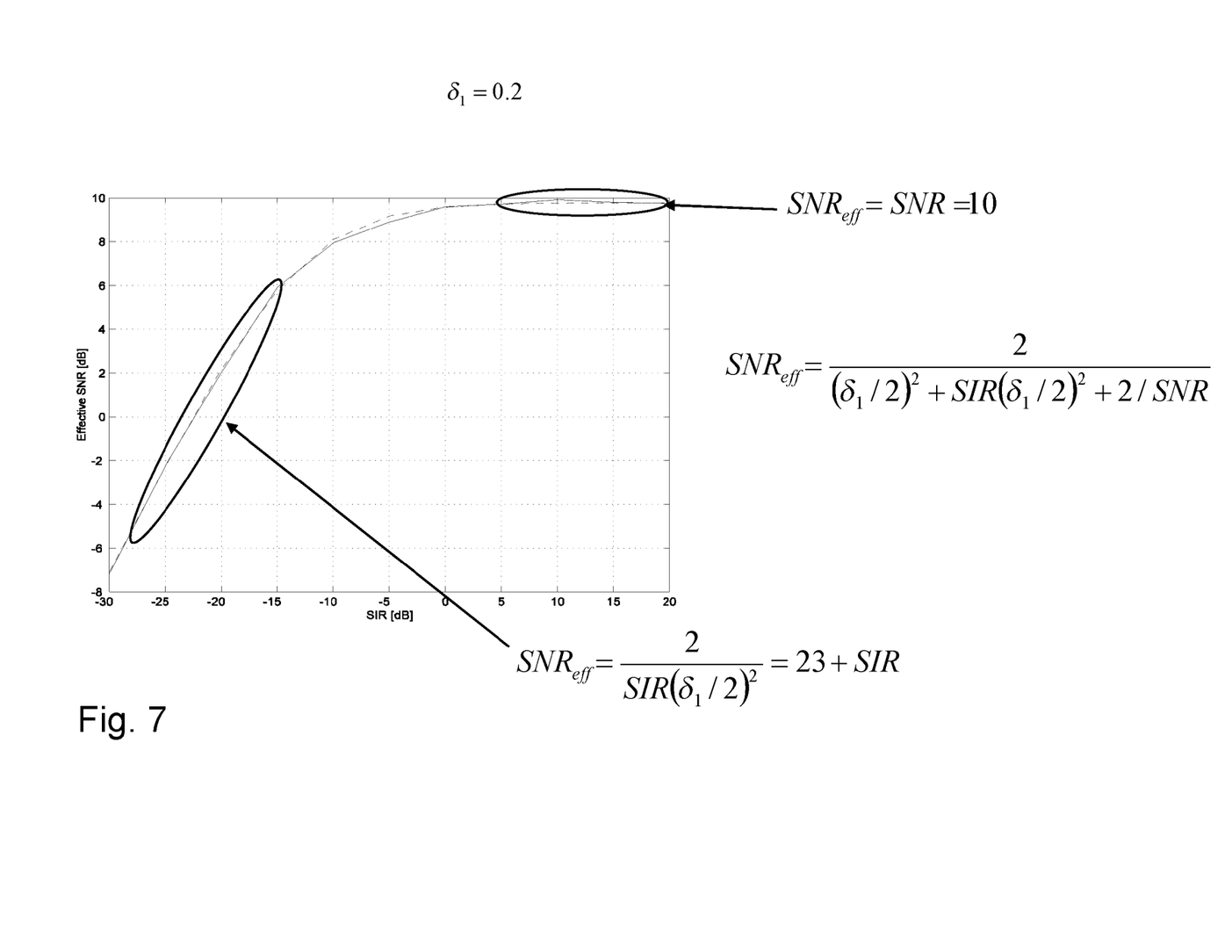
FIG. 7 shows a simulation result of the estimated effective SNR compared to the corresponding expected theoretical values where SNR=10 dB and $\delta_1$=0.2.

FIGS. 6 and 7 show simulation results for the estimated effective SNR ($SNR_{eff}$) compared to the expected theoretical values, as predicted using the formula above. The estimation is done using 10 OFDM symbols, each containing 200 subcarriers. As can be clearly seen from these figures, the agreement between the estimated effective SNR and the theoretical values is good.

It can be noted that for $\delta_1=0$, it follows, as expected, that $SNR_{eff}=SNR$, which means that SNR is readily determined. Since the SNR can be expected to be a slowly varying parameter, the determined SNR value can be assumed to remain unchanged when $\delta_1$ is changed. Rewriting the equation for the $SNR_{eff}$ gives the following:

$$SIR = \frac{\delta_1^2}{8} \frac{1}{\frac{1}{SNR_{eff}} - \frac{1}{SNR} - \frac{1}{8}\delta_1^2}$$

This equation means that, once $SNR_{eff}$ and SNR are determined, the SIR can be determined, using the knowledge of $\delta_1$.

Since the power level of the desired signal component is known, the power of the signal component located at the image frequency can be readily obtained. This function corresponds to step 106 of the method 100 as shown in FIG. 11, and it can be achieved using various implementations.

In a first implementation, the power of the signal component at the image frequency can be determined using $SNR_{eff}$, SNR, and $\delta_1$, as described above. If SIR is found to be sufficiently large, say at least 20 dB, it may be decided that there is no signal at all at the image frequency. To ease such a measurement, the leakage should preferably be as large as possible, i.e., $\delta_1$ should be chosen large in the example above.

In a second implementation, which relates to the situation where determination of the power of the signal component at the image frequency is done simultaneously as signal reception, some extra care is preferable with respect to the selection of $\delta_1$. Specifically, there is a trade-off between choosing a large $\delta_1$ to obtain more accurate determination result and choosing a small $\delta_1$ to cause a small degradation of the desired signal component. Therefore in the second implementation, $\delta_1$ may be chosen as large as possible but still small enough so that the resulting degradation of the desired signal component is acceptable. In one example of the second implementation, this is achieved as follows.

First, the SNR of the desired signal component is determined and the acceptable degradation of this SNR is determined; moreover, an upper bound for interferer strength is determined. Then, based on these parameters $\delta_1$ is calculated. To illustrate with some specific, numerical values, suppose that SNR=20 dB, that a 3 dB degradation can be accepted, and that the signal component at the image frequency can be safely assumed to not be more than 30 dB stronger than the desired signal component. Inserting SIR=−30 dB into the equation for the $SNR_{eff}$ and neglecting the effect of in-band leakage (which is safely done if SIR=−30 dB) this translates into $$\frac{1}{0.001}(\delta_1/2)^2 = 2/100 \Rightarrow |\delta_1|$$
$$= 0.009$$

If a larger degradation can be accepted, $\delta_1$ can be increased, and vice versa. Similarly, if the SNR is smaller, $\delta_1$ can be increased, and vice versa.

Figure 8:
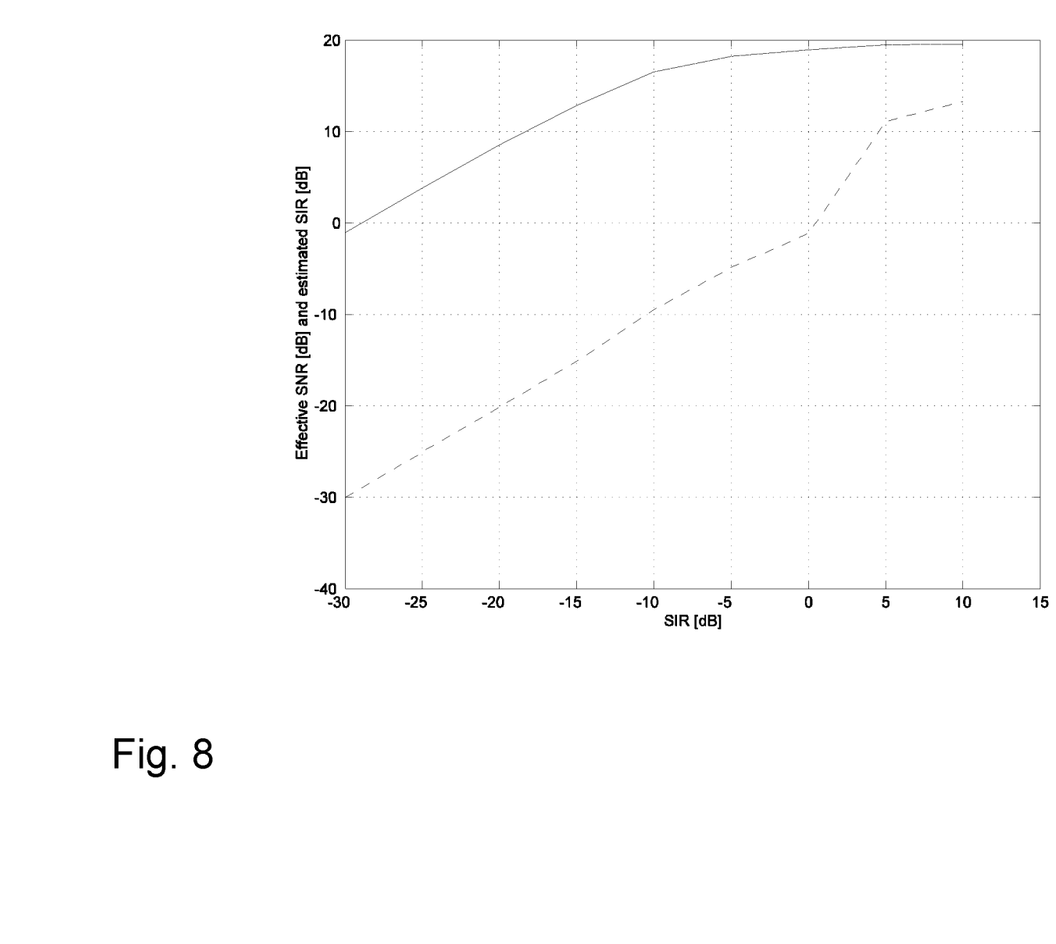
FIG. 8 shows the effective SNR as a function of the SIR as well as the estimated SIR as a function of the SIR where SNR=20 dB and $\delta_1$=0.1.
Figure 9:
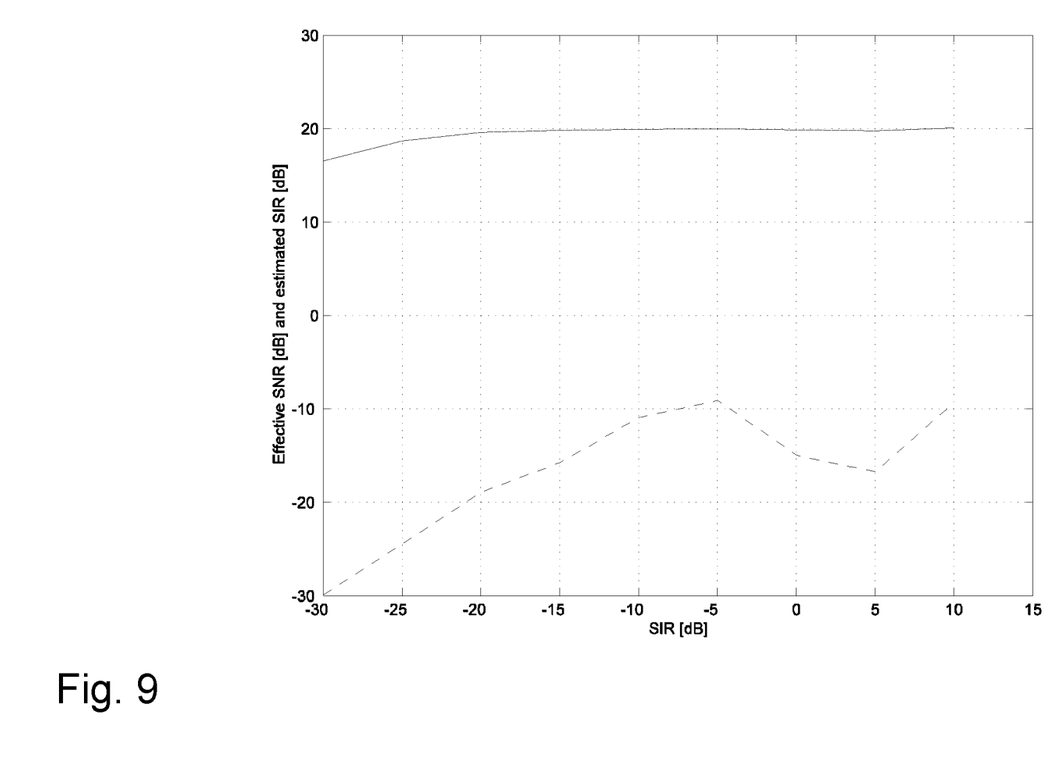
FIG. 9 shows the effective SNR as a function of the SIR as well as the estimated SIR as a function of the SIR where SNR=20 dB and $\delta_1$=0.01.
Figure 10:
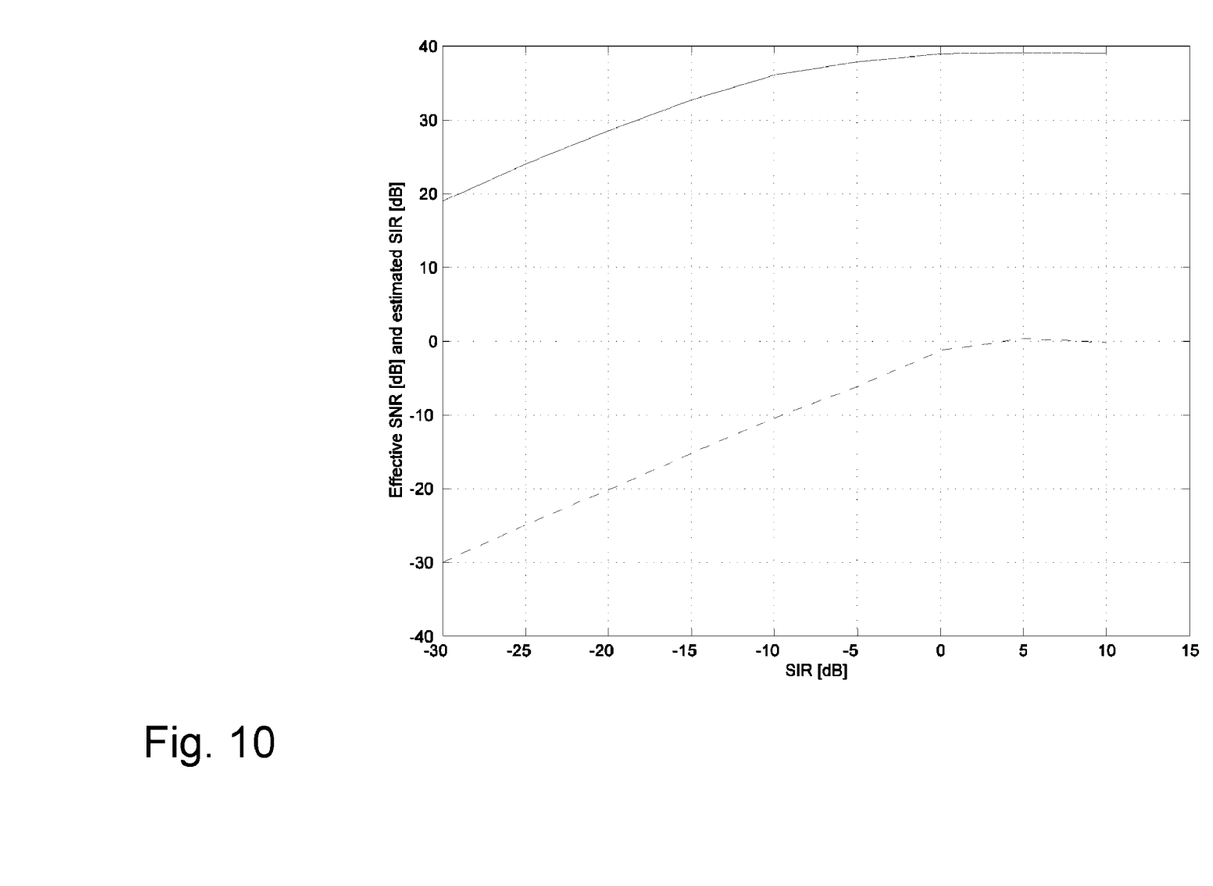
FIG. 10 shows a further simulation result of the estimated effective SNR compared to the corresponding expected theoretical values where SNR=40 dB and $\delta_1$=0.01.

FIGS. 8-10 show $SNR_{eff}$ as a function of SIR (solid line) as well as the estimated SIR as a function of SIR (dashed line). As expected, the higher the level of interference (i.e., smaller SIR) is, the more accurate the determination. However, when the interference is too strong, $SNR_{eff}$ may be degraded considerably. In FIG. 8, it is chosen that SNR=20 dB and $\delta_1=0.1$. As a result of this large value of $\delta_1$, the SNR degradation is only reasonable for, say, SIR>−5 dB. The determination, on the other hand, is only reasonable for SIR<5 dB, implying that this value of $\delta_1$ is suitable for SIR in the region −5 dB to 5 dB.

In FIG. 9, the same SNR value is chosen as in FIG. 8 but $\delta_1$ is chosen to be 0.01. As can be seen, $SNR_{eff}$ can probably be considered as acceptable for SIR>−25 dB, whereas the accuracy of the determination of SIR is acceptable for SIR<−10 dB; thus implying that this value of $\delta_1$ is suitable for SIR in the region −25 dB to −10 dB. Overall, for a given SIR, the value of $\delta_1$ can be chosen so that both the SIR can be determined at the same time as the caused degradation is reasonably small.

Finally, FIG. 10 shows the situation where SNR=40 dB and $\delta_1=0.01$. Comparing this with FIG. 9, where the same value for $\delta_1$ is used, it is readily seen that the SIR region for which this $\delta_1$ is suitable is shifted towards larger SIR values in order to cause marginal degradation.

It is possible to improve the accuracy of the power estimation of the signal component at the image frequency by allowing for an increased estimation time. Thus, in order to achieve a certain level of accuracy, one may either choose a relatively small $\delta_1$ and perform a relatively long estimation, or one may choose a relatively large $\delta_1$ and perform a relatively short estimation.

In a third implementation, the possibility of signal reception at one frequency simultaneously with signal scanning at another frequency (e.g., located at the image of the desired signal) is realized. Specifically, since the image frequency is at twice the IF frequency, it is possible to scan for a signal at a desired frequency at the same time as receiving the desired signal at a given frequency by choosing the IF properly. Hence it is in principle possible to perform signal reception at one desired frequency simultaneously with determining the power of the signal component at another desired frequency.

For instance, a large bandwidth can be scanned by adjusting the IF in a suitable manner. This means that the image frequency can be altered to allow the power of the signal component at the image frequency be determined for more than one specific frequency.

To illustrate this approach with some numerical values, suppose that Band 40 is being used, which is located between 2300 MHz and 2400 MHz; moreover, suppose that signal reception is carried out on a 5 MHz channel located at 2395 MHz-2400 MHz and that it is chosen to receive the desired signal at the upper sideband of the receiver. The entire Band 40 may now be scanned in order to find out whether there is any potential frequency available for handover. The scanning may then be performed as follows: The IF is chosen to be 47.5 MHz, implying that the RF mixer is at 2350 MHz, so that the USB is centered at 2397.5 MHz and the image is centered at 2302.5 MHz. The channel centered at 2302.5 MHz is scanned using the procedure described in the second implementation simultaneously as receiving the desired signal centered at 2397.5 MHz. Once the determination is completed for this channel, the scanning continues with the next potential channel to which a handover can be performed, i.e., the channel centered at 2307.5 MHz. This can be accomplished by increasing the frequency of the RF mixer to 2352.5 MHz and reducing the frequency of the IF mixer to 45.0 MHz. By increasing the frequency of the RF mixer in steps of 2.5 MHz and at the same time reducing the frequency of the IF mixer with the same amount, the entire Band 40 can be eventually scanned.

Depending on when the change of frequencies in the RF mixer and the IF mixer takes place, signal reception may need to be interrupted, e.g., for a short period of time. This period of time is usually, however, negligible in view of the time needed to perform the determination. For the example given above, where Band 40 is scanned, the change of frequency is preferably done while changing from reception to transmission or vice versa (Since Band 40 is used for TDD, the device will alter between transmission and reception.) In case a downlink data frame is to be received, one may, after decoding the control information, obtain the information that not the entire downlink frame contains useful data. If this is the case, extra time is available for changing the frequencies of the RF mixer and the IF mixer. In case the downlink-uplink switching time is not sufficient one may choose to stop the signal reception before the downlink frame is completely received or choose not to receive it at all. In this way there will be plenty of time to adjust the mixer frequencies (e.g., in excess of 1 ms) and the lost data will be received later through the use of retransmission protocols.

In a fourth implementation, the scanning for suitable frequencies used for handover is combined with obtaining information from the communication network concerning what frequencies are used in the region. Typically, a user equipment may maintain or have access to a list of frequencies which should be scanned in order to always have a list of potential candidates for handover. If such a list of possible frequencies is available, the scanning may be limited to these frequencies.

The numerical examples above are based on the architecture depicted in FIG. 4. In case the IF mixer is instead based on the architecture illustrated in FIG. 5, the procedure is analogous. Specifically, it can be shown that $$USI = \frac{1 + gh_2\cos(\varphi_1 + \theta_2)}{2}\cos(\omega_1 + \omega_2)t - \frac{gh_2\sin(\varphi_1 + \theta_2)}{2}\sin(\omega_1 + \omega_2)t +$$
$$\frac{1 - gh_2\cos(\varphi_1 - \theta_2)}{2}\cos(\omega_1 - \omega_2)t + \frac{gh_2\sin(\varphi_1 - \theta_2)}{2}\sin(\omega_1 - \omega_2)t$$
$$USQ = \frac{g\sin(\varphi_1) + h_1\sin(\theta_1)}{2}\cos(\omega_1 + \omega_2)t -$$
$$\frac{g\cos(\varphi_1) + h_1\cos(\theta_1)}{2}\sin(\omega_1 + \omega_2)t -$$
$$\frac{g\sin(\varphi_1) + h_1\sin(\theta_1)}{2}\cos(\omega_1 - \omega_2)t - \frac{g\cos(\varphi_1) - h_1\cos(\theta_1)}{2}\sin(\omega_1 - \omega_2)t$$

Again, it is straight-forward to see that the signal at the image frequency can be cancelled by choosing $\theta_2 = \varphi_1; h_2 = 1/g \; \theta_1 = -\varphi_1; h_1 = g$ This corresponds to step 102 in FIG. 11. Step 104 would in this case imply intentionally introducing some leakage by choosing some of the parameters in the IF mixer slightly differently. With the same assumptions that were used when describing the other architecture, i.e., g=1; $\phi$=0, it follows that there would be no leakage with $\theta_2 = \theta_1 = 0; h_2 = h_1 = 1$ Intentional leakage could then be introduced, for instance, by letting $\theta_1 \neq 0$. In a similar way as for the other architecture, there will be no leakage from the image frequency into the in-phase component, whereas the quadrature component will contain interference due to leakage. Based on the formula for USQ above, the following approximation for the effective SNR can be derived:

$$SNR_{eff} \approx \frac{2}{\frac{1}{SIR}(\theta_1/2)^2 + 2/SNR}$$

This is similar to the expression for the other architecture, but neglecting the term for in-band interference.

The technique presented in this disclosure may be used for a radio communication device (e.g., a user terminal) to scan for candidate frequencies or channels. Traffic capacity loss will be experienced if the user data traffic has to be stopped during the scanning procedure, such as at periodical time intervals (i.e., gaps). It would be desirable if the scanning could be done simultaneously with the normal traffic. This goal can be achieved by the technique described herein with a CIF-based receiver, which can process two different carriers simultaneously. Such a receiver is normally used to achieve a high image rejection ratio by striving for a "perfect" receiver (by subtracting a normalized version of the image signal from the wanted signal). By introducing an intentional leakage from the image frequency, such a receiver can be used to detect the power of the image frequency by measuring the desired signal. A deliberate mismatch will translate a signal at one sideband (lower side) to SNR at the other sideband (upper side). By choosing the mismatch ($\delta_1$) properly, this power determination can be performed simultaneously with the reception of the desired signal.

Although certain embodiments of the CIF-based receiver and the related methods have been illustrated in the accompanying drawings and described in the foregoing description, it will be understood that the invention is not limited to the embodiments disclosed herein. The CIF-cased receiver and the methods are capable of numerous rearrangements, modifications, and component/step substitutions without departing from the scope of the invention.

The invention claimed is:

1. A method of determining signal power in a complex intermediate frequency-based (CIF-based) receiver adapted to process a received signal that comprises a signal component at a desired frequency and a signal component at an image frequency, the method comprising:
    calibrating the CIF-based receiver to minimize the power of the signal component at the image frequency that interferes with the signal component at the desired frequency;
    introducing signal leakage from the image frequency to intentionally degrade the quality of the signal component at the desired frequency; and
    determining the power of the signal component at the image frequency based on the amount of degradation.

2. The method according to claim 1, wherein the CIF-based receiver comprises at least one RF mixer and a plurality of IF mixers and the method further comprises:
    adjusting at least one of the IF mixers to cancel mismatch caused by the at least one RF mixer for at least one of the desired frequency and the image frequency.

3. The method according to claim 2, wherein the mismatch caused by the RF mixer defines at least to what extent the signal component at the image frequency leaks into the desired frequency or vice versa.

4. The method according to claim 1, further comprising:
    determining an image-rejection ratio of the CIF-based receiver, based on the amount of degradation.

5. The method according to claim 1, further comprising:
    determining a signal-to-noise ratio of the desired signal component.

6. The method according to claim 1, further comprising:
    determining a signal-to-image-ratio (SIR) which is defined as a ratio between the power of the desired signal component and the power of the signal component at the image channel.

7. The method according to claim 6, further comprising:
    determining a signal-to-noise ratio (SNR) of the desired signal component,
    wherein the SIR is determined based on the SNR.

8. The method according to claim 6, wherein the SIR is determined by means of a channel estimator.

9. The method according to claim 6, further comprising:
    determining the power of the signal component at the image frequency based on the power of the signal component at the desired frequency using the SIR.

10. The method according to claim 1, further comprising:
    performing signal reception on one desired frequency simultaneously with determining the power of the signal component at the image frequency.

11. The method according to claim 1, further comprising:
    altering the image frequency to allow the signal power to be determined for more than one specific frequency.

12. The method according to claim 11, further comprising:
    selecting a frequency among a plurality of the frequencies for which the signal power is determined in a handover context or in a carrier aggregation context.

13. The method according to claim 11, wherein at least one of the altering and the selecting steps is based on a list of suitable frequencies obtained from a communication network.

14. A nontransitory computer-readable recording medium having stored therein a computer program product comprising program code portions for performing the steps of a method when executed by a computing device, wherein the method is a method of determining signal power in a complex intermediate frequency-based (CIF-based) receiver adapted to process a received signal that comprises a signal component at a desired frequency and a signal component at an image frequency, the method comprising:
    calibrating the CIF-based receiver to minimize the power of the signal component at the image frequency that interferes with the signal component at the desired frequency;
    introducing signal leakage from the image frequency to intentionally degrade the quality of the signal component at the desired frequency; and
    determining the power of the signal component at the image frequency based on the amount of degradation.

15. A receiver comprising a complex intermediate frequency (CIF) mixer adapted to process a received signal which comprises a signal component at a desired frequency and a signal component at an image frequency, wherein the receiver is configured to:
    calibrate the CIF mixer to minimize the power of the signal component at the image frequency that interferes with the signal component at the desired frequency;
    introduce signal leakage from the image frequency to intentionally degrade the quality of the signal component at the desired frequency; and
    determine the power of the signal component at the image frequency based on the amount of degradation.

16. The receiver of claim 15, wherein the receiver further comprises at least one RF mixer and the CIF mixer further comprises a plurality of IF mixers, and wherein the receiver is further configured to adjust the at least one of the IF mixers to cancel mismatch caused by the at least one RF mixer for at least one of the desired frequency and the image frequency.

17. The receiver of claim 15, further configured to determine an image-rejection ratio of the CIF-based receiver.

18. The receiver of claim 15, further configured to determine the power of the signal component at the image frequency based on the power of the signal component at the desired frequency using a signal-to-image-ratio which is defined as a ratio between the power of the desired signal component and the power of the signal component at the image channel.

19. The receiver of claim 16, further configured to perform signal reception on one desired frequency simultaneously with determining the power of the signal component at either the image frequency or another desired frequency.

20. The receiver of claim 15, further configured to alter the image frequency to allow the signal power to be determined for more than one specific frequency.

21. The receiver of claim 20, further adapted to select a frequency among a plurality of the frequencies for which the signal power is determined in a handover context or in a carrier aggregation context.

22. The receiver of claim 20, further configured to alter the image frequency or select the frequency from among the plurality of the frequencies based on a list of suitable frequencies obtained from a communication network.

23. The receiver of claim 15, integrated in any one of a user terminal, a base station, and an access point.

* * * * *